(12) United States Patent
Mahler et al.

(10) Patent No.: US 8,450,148 B2
(45) Date of Patent: May 28, 2013

(54) MOLDING COMPOUND ADHESION FOR MAP-MOLDED FLIP-CHIP

(75) Inventors: Joachim Mahler, Regensburg (DE); Edward Fuergut, Dasing (DE)

(73) Assignee: Infineon Technologies, AG, Neubiberg (DE)

( * ) Notice: Subject to any disclaimer, the term of this patent is extended or adjusted under 35 U.S.C. 154(b) by 481 days.

(21) Appl. No.: 11/638,671

(22) Filed: Dec. 14, 2006

(65) Prior Publication Data

US 2008/0142992 A1 Jun. 19, 2008

(51) Int. Cl.
*H01L 21/00* (2006.01)

(52) U.S. Cl.
USPC ......... 438/108; 438/112; 438/124; 438/127; 257/778; 257/787

(58) Field of Classification Search
USPC ............ 428/209, 448, 255.18, 40.1; 257/667, 257/E21.499, 669–787; 438/29, 112, 118, 438/108; 399/226; 174/261; 29/840
See application file for complete search history.

(56) References Cited

U.S. PATENT DOCUMENTS

| | | | |
|---|---|---|---|
| 4,020,218 A * | 4/1977 | Ranney et al. ............... | 428/447 |
| 4,230,754 A | 10/1980 | Maher et al. | |
| 4,985,751 A | 1/1991 | Shiobara et al. | |
| 5,116,643 A * | 5/1992 | Miller et al. ............... | 427/126.3 |
| 5,227,661 A | 7/1993 | Heinen | |
| 5,274,913 A * | 1/1994 | Grebe et al. ................... | 29/840 |
| 5,371,328 A * | 12/1994 | Gutierrez et al. ............. | 174/261 |
| 5,418,189 A | 5/1995 | Heinen | |
| 5,554,569 A | 9/1996 | Ganesan et al. | |
| 5,684,327 A * | 11/1997 | Nakazawa et al. ............ | 257/667 |
| 5,864,178 A * | 1/1999 | Yamada et al. ............... | 257/737 |
| 5,962,097 A * | 10/1999 | Yamamoto et al. .......... | 428/40.1 |
| 6,251,501 B1 * | 6/2001 | Higdon et al. ................ | 428/209 |
| 6,429,238 B1 | 8/2002 | Sumita et al. | |
| 6,713,852 B2 | 3/2004 | Abbott et al. | |
| 6,751,432 B2 * | 6/2004 | Gervasi ......................... | 399/266 |
| 6,962,727 B2 * | 11/2005 | Bedwell et al. ............ | 427/255.18 |
| 7,256,496 B2 * | 8/2007 | Okada et al. .................. | 257/737 |
| 7,390,684 B2 * | 6/2008 | Izuno et al. ..................... | 438/29 |
| 2002/0134408 A1 | 9/2002 | Christison et al. | |
| 2003/0170444 A1 | 9/2003 | Stewart et al. | |
| 2004/0082107 A1 * | 4/2004 | Shi et al. ........................ | 438/108 |
| 2004/0251561 A1 | 12/2004 | Wilson et al. | |
| 2005/0175850 A1 | 8/2005 | Koyano et al. | |
| 2006/0275616 A1 * | 12/2006 | Clough et al. ................ | 428/448 |
| 2007/0262426 A1 * | 11/2007 | Mahler ........................... | 257/669 |

FOREIGN PATENT DOCUMENTS

| | | |
|---|---|---|
| DE | 102004047510 | 4/2006 |
| EP | 0478250 A1 | 4/1992 |
| EP | 1657742 A1 | 5/2006 |
| JP | 61123620 A | 6/1986 |

* cited by examiner

*Primary Examiner* — Eugene Lee
*Assistant Examiner* — Fang-Xing Jiang
(74) *Attorney, Agent, or Firm* — Edell, Shapiro & Finnan, LLC

(57) ABSTRACT

A semiconductor device whose semiconductor device components have particularly reliable adhesion to a plastic housing composition surrounding them is intended to be produced by a simplest possible method. An adhesion promoting solution is introduced into the interspace between the front side of the flip-chips and the top side of the substrate and the solvent from the adhesion promoting solution is evaporated with formation of an adhesion promoting coating on the front sides of the semiconductor chips and the top side of the substrate. The semiconductor chip and the top side of the substrate are subsequently embedded into a plastic housing composition.

10 Claims, 2 Drawing Sheets

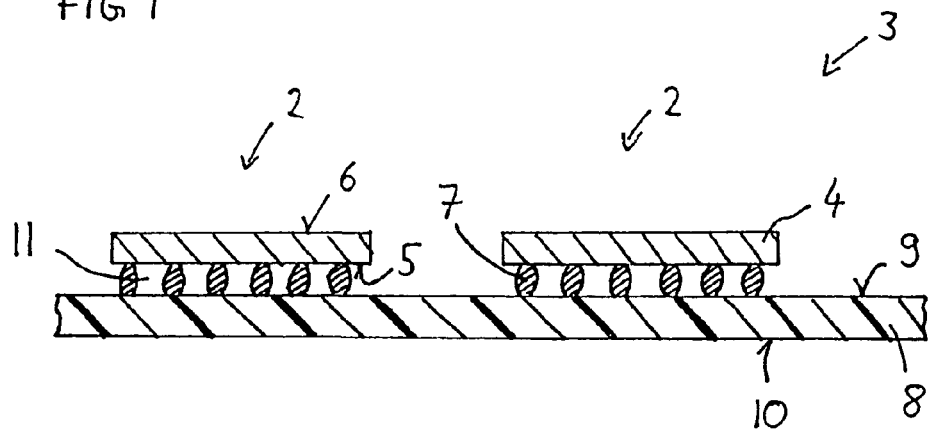
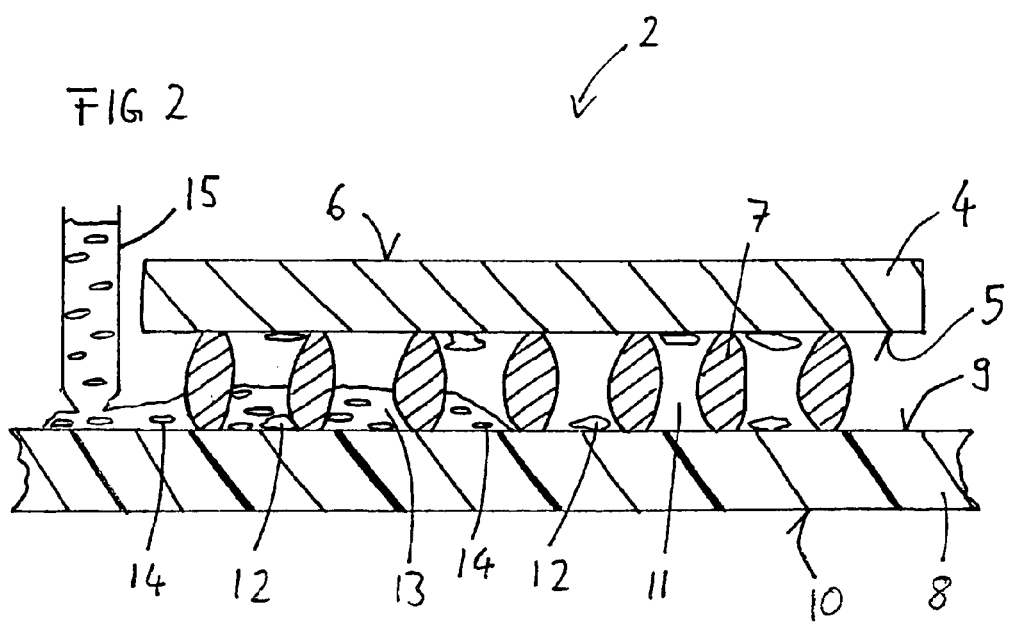

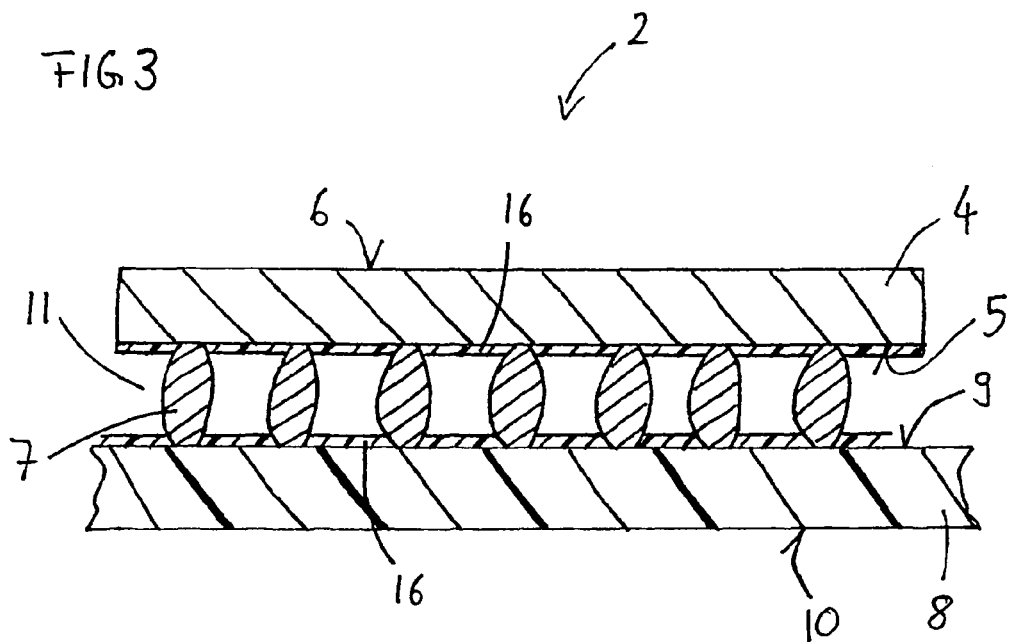
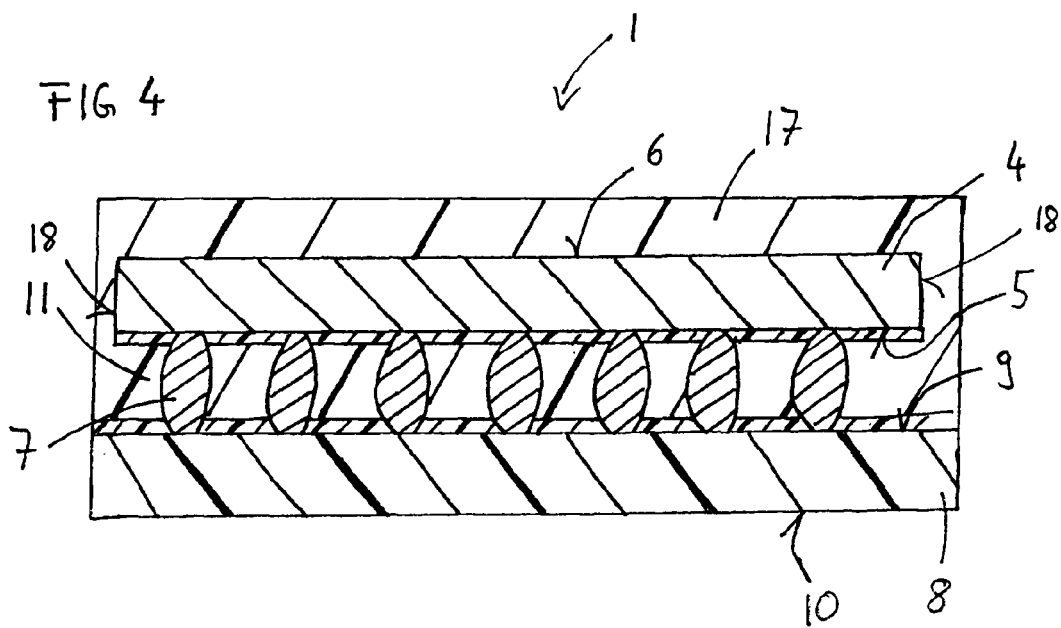

MOLDING COMPOUND ADHESION FOR MAP-MOLDED FLIP-CHIP

FIELD

The invention relates to a semiconductor device, in particular comprising a semiconductor chip applied to a substrate using flip-chip technology, which is embedded in a plastic housing. It furthermore relates to a method for producing such a semiconductor device.

BACKGROUND

What is problematic in the case of such a semiconductor device is that a lack of adhesion between a substrate and the plastic housing composition enables moisture to accumulate in the boundary layer between substrate and plastic housing composition. Said moisture expands abruptly if the semiconductor device is heated from room temperature to temperatures up to 260° C. within a very short time during soldering onto a printed circuit board. The abrupt expansion of the moisture content results in cracks and/or fractures in the plastic housing of the semiconductor device, which is referred to as the "popcorn effect".

In order to prevent this popcorn effect, it is necessary to prevent the accumulation of moisture in the boundary layer between semiconductor device components and plastic housing composition. The accumulation of moisture can be reduced by improving the adhesion between the surfaces of the semiconductor device components and the surface of the plastic housing composition. Various approaches are known for improving said adhesion. U.S. Pat. No. 5,554,569 discloses a method for mechanically roughening the surface of a leadframe. The roughened surface enables intermeshing with the plastic housing composition and hence better adhesion. However, this method is difficult and cost-intensive to carry out. Moreover, this method cannot be employed on all substrates, nor on the active top side of a flip-chip.

Particularly in the case of semiconductor devices embodied using flip-chip technology, the problem additionally occurs that from the soldering of the semiconductor chip onto the substrate, corrosive residues of soldering resist are present between the semiconductor chip and the substrate, which can damage the device and/or additionally reduce the adhesion of the plastic housing composition.

Therefore, there is still a need for a semiconductor device whose semiconductor device components have a reliable adhesion to a plastic housing composition surrounding them.

SUMMARY

A semiconductor device according to the invention has a substrate having a top side and an underside and a semiconductor chip mounted on the substrate. The semiconductor chip has a front side and a rear side, flip-chip contacts being arranged on contact areas of the front side, via which flip-chip contacts the semiconductor chip is connected to contact pads on the top side of the substrate using flip-chip technology. The front side of the semiconductor chip and the top side of the substrate have a coating comprising silanes and/or organometallic molecules.

The invention is based on the consideration that a method for producing semiconductor devices that saves as much as time and as many costs as possible should have as few and as simple method steps as possible which, in addition, can also be performed simultaneously for a large number of semiconductor devices. For better adhesion of the plastic housing composition on the surfaces of the semiconductor device components, it is also possible to remove the soldering resist residues on the top side of the substrate and the front side of the semiconductor chip. For this purpose, it is possible to add to a cleaning solution primer molecules for the production of an adhesion promoting layer.

In this way, it is possible to carry out the cleaning of the corresponding surfaces and their coating with an adhesion promoting layer in a single method step. For this purpose, a solvent is chosen for the cleaning and adhesion promoting layer which is both a carrier for the primer molecules of the adhesion promoting layer and is suitable for dissolving residues and contaminants from the surfaces to be treated. The residues and contaminants can be evaporated in dissolved form together with the solvent, while the primer molecules remain behind and form an adhesion promoting layer.

In one preferred exemplary embodiment the rear side and the front side of the semiconductor chip, the surfaces of the flip-chip contacts and the top side and the underside of the substrate form interfaces with a plastic housing composition. That is to say that the semiconductor chip is embedded completely and the substrate is embedded at least by its top side into the plastic housing composition.

In one exemplary embodiment, only the front side of the semiconductor chip and the top side of the substrate have the coating comprising silanes and/or organometallic molecules, while the remaining interfaces with the plastic housing composition are kept free of the coating. It is thus possible to perform a targeted coating and, if appropriate, cleaning of the surfaces that are particularly affected, that is to say particularly contaminated. For this purpose, the cleaning and/or adhesion promoting solution is introduced very simply into the interspace between semiconductor chip and substrate, with the result that the adhesion promoting layer forms on the front side of the semiconductor chip and on the top side of the substrate.

The semiconductor chip typically has an active front side with integrated circuits and contact areas and a passive rear side. However, other embodiments are also conceivable for example a rewiring structure and contact areas on the rear side of the semiconductor chip, for example, if the latter is provided for stacking.

The coating of the front side of the semiconductor chip and the top side of the substrate has a thickness d for which 1 nm$\leq$d$\leq$10 µm advantageously holds true. 10 nm$\leq$d$\leq$1 µm preferably holds true. A layer having this thickness can be applied well in the interspace between semiconductor chip and substrate, which has a thickness only of a few tens of µm.

A method according to the invention for producing a semiconductor device has the following steps: the first step involves providing a substrate having a top side and an underside and a multiplicity of semiconductor device positions arranged in columns and rows, said substrate having contact pads on its top side. A semiconductor chip having a front side and a rear side is furthermore provided, said semiconductor chip having contact areas on its front side.

The semiconductor chip is applied using flip-chip technology to the top side of the substrate with connection of the contact areas on the front side to the contact pads of the substrate by flip-chip contacts and with formation of interspaces between the front side of the semiconductor chip and the top side of the substrate.

A cleaning and adhesion promoting solution is introduced into the interspaces between the front side of the semiconductor chip and the top side of the substrate, said solution dissolving residues of soldering resist and other contaminants that reduce the adhesion to a plastic housing composition on the surfaces of the semiconductor device. Its solvent is subsequently evaporated. In this case, an adhesion promoting coating forms on the front side of the semiconductor chip and the top side of the substrate. The semiconductor device is subsequently embedded into a plastic housing composition.

If a plurality of semiconductor devices are produced in parallel by application of a plurality of semiconductor chips to respective semiconductor device positions on a substrate for a plurality of semiconductor devices, the semiconductor chips and the top side of the substrate are embedded into a plastic housing composition and the panel is singulated into semiconductor devices.

A combined cleaning and adhesion promoting solution is assumed hereafter, it also being possible solely to use an adhesion promoting solution comprising silanes and/or organometallic constituents.

In one exemplary embodiment, a solution comprising 0.1-10 percent by mass of silane, 1-10 percent by mass of deionized water and 85-99 percent by mass of alcohol, for example ethanol, is used as the cleaning and adhesion promoting solution. By way of example, N-(3-trimethoxysilyl)alkyl)diamine is provided as the silane.

In an alternative exemplary embodiment, a solution comprising 0.1-10 percent by mass of organometallic compounds, 1-10 percent by mass of deionized water and 85-99 percent by mass of alcohol, for example ethanol, is used as the cleaning and adhesion promoting solution.

The solvent is advantageously evaporated by heating the semiconductor devices to a temperature T of at least 80 to 150° C.

The introduction of the cleaning and adhesion promoting solution into the interspace is advantageously effected in a dispensing process. On account of its low viscosity and the high capillary forces that act in the narrow interspace, the solution fills the entire interspace.

As an alternative, the application of the cleaning and adhesion promoting solution may also be effected by dipping. In this case, at least parts of the underside of the substrate are advantageously covered prior to dipping, so that they or external contacts of the semiconductor devices that are arranged there are kept free of the coating.

The method according to the invention has the advantage that it provides adhesion promotion between surfaces of semiconductor devices and a plastic housing composition in a particularly simple manner. In particular the surfaces at which the adhesion is reduced to a particularly great extent on account of contaminants, for example due to corrosive soldering resist, are coated in this case. The simultaneous cleaning of said surfaces by the solvent in the cleaning and adhesion promoting solution results in particularly good adhesion without necessitating separate or complicated method steps.

The method can be used particularly well in the production of semiconductor devices in a panel and in the case of so-called map molding, in which a plurality of semiconductor devices are simultaneously embedded in plastics composition in a mold tool prior to singulation.

Exemplary embodiments of the invention are explained in more detail below with reference to the accompanying figures.

BRIEF DESCRIPTION OF THE DRAWINGS

FIG. 1 schematically shows a cross section through a panel with semiconductor devices in a first step of a method according to the invention;

FIG. 2 shows a second step of the method according to the invention;

FIG. 3 shows a third step of the method according to the invention; and

FIG. 4 schematically shows a cross section through the finished semiconductor device according to the invention.

DETAILED DESCRIPTION

Identical parts are provided with the same reference symbols in all of the figures.

FIG. 1 shows a cross section through a panel 3 comprising a substrate 8 and a plurality of semiconductor chips 4 applied in semiconductor device positions 2. Only two semiconductor device positions 2 with semiconductor chips 4 are illustrated in FIG. 1.

The semiconductor chips 4 have an active front side 5 and a passive rear side 6, contact areas (not illustrated) of the semiconductor chips 4 being arranged on the active front side 5.

The substrate 8 has a top side 9 and an underside 10, contact pads (not illustrated) being arranged on the top side 9. The semiconductor chips 4 are mounted onto the substrate 8 by means of flip-chip contacts 7, which electrically and mechanically connect the contact areas of the semiconductor chips 4 to the contact pads on the top side 9 of the substrate 8.

A rewiring substrate such as is usually used for semiconductor devices in flip-chip technology is provided as the substrate in this exemplary embodiment. However, by way of example, a leadframe is also conceivable as the substrate.

For the purpose of soldering the semiconductor chips 4 onto the substrate 8, usually a soldering resist layer is applied to the substrate, only the contact pads being kept free of said soldering resist layer and the latter preventing wetting of the rest of the top side 9 of the substrate 8. After soldering, residues of the corrosive soldering resist remain in the interspace 11 between the active front side 5 of the semiconductor chips 4 and the top side 9 of the substrate 8.

FIG. 2 shows these contaminants 12, which are situated for example on the active front side 5 of the semiconductor chips 4 and on the top side 9 of the substrate 8. Not only are said contaminants 12 corrosive and can therefore permanently damage parts of the semiconductor chip, but they also reduce the adhesion of the active front side 5 of the semiconductor chips 4 and the top side 9 of the substrate 8 to a plastic housing composition.

FIG. 2 shows a first step of a method according to the invention. A cleaning and adhesion promoting solution 13 containing a solvent and primer molecules 14 is introduced into the interspace 11 between the active front side 5 of the semiconductor chips 4 and the top side 9 of the substrate 8. In this case, the solvent simultaneously functions as a carrier for the primer molecules 14 and as a cleaning agent that dissolves the contaminants 12. The primer molecules 14 are molecules provided for forming an adhesion promoting layer.

In the exemplary embodiment shown in FIG. 2, the cleaning and adhesion promoting solution 13 is introduced into the interspace 11 in a dispensing process with the aid of a dispensing tool 15. On account of the low viscosity of the cleaning and adhesion promoting solution 13 and the high capillary forces that act in the interspace 11, which has a width of only a few tens of μm, the cleaning and adhesion promoting solution 13 creeps into the interspace 11 and completely fills it.

In a subsequent method step, the result of which is illustrated in FIG. 3, the entire panel 3 is heated to a temperature above the boiling point of the solvent. Said boiling point is typically 80-150° C. The heated solvent evaporates and only the primer molecules remain behind, which then form an adhesion promoting coating 16 on the active front sides 5 of the semiconductor chips 4 and on the top side 9 of the substrate 8.

In this case, the adhesion promoting coating 16 essentially comprises silanes or organometallic molecules which crosslink, for example, during the application and/or curing of a plastic housing composition and thus ensure a particularly good connection between the semiconductor chips 4 and the substrate 8, on the one hand, and the plastic housing composition, on the other hand.

FIG. 4 shows the finished semiconductor device 1 that has been produced according to the method according to the invention and singulated from the panel. In this embodiment, the semiconductor device 1 has a semiconductor chip 4 mounted on the top side 9 of the substrate 8 using flip-chip technology. The semiconductor chip 4 is embedded completely and the substrate 8 is embedded by its top side 9 into a plastic housing composition 17, which forms a protective housing for the semiconductor device 1.

By way of example, a map molding process is used for embedding into the plastic housing composition, which process permits semiconductor devices of an entire panel to be simultaneously provided with a plastic housing.

The contaminants such as soldering resist residues, for example, have been removed from the interspace 11 with the aid of the solvent from the cleaning and adhesion promoting solution.

The front side 5, the rear side 6 and the lateral areas 18 of the semiconductor chip 4 and also the top side 9 of the substrate 8 and the surfaces of the flip-chip contacts 7 form interfaces with the plastic housing composition 17. Of said interfaces, however, only the active front side 5 of the semiconductor chip 4 and the top side 9 of the substrate 8 are coated with the adhesion promoting coating 16.

The invention claimed is:

1. A method for producing a semiconductor device, the method comprising:
   providing a substrate including a top side and an underside, said substrate including contact pads on the top side of the substrate;
   providing a semiconductor chip including a front side and a rear side, said semiconductor chip including contact areas on the front side of the semiconductor chip;
   connecting the contact areas on the front side of the semiconductor chip to the contact pads of the substrate using flip-chip contacts, wherein interspaces are formed between the front side of the semiconductor chip and the top side of the substrate upon connection of the semiconductor chip to the substrate with the flip-chip contacts;
   providing an adhesion promoting solution in the interspaces between the front side of the semiconductor chip and the top side of the substrate;
   evaporating a solvent from the adhesion promoting solution so as to form an adhesion promoting coating disposed on the front side of the semiconductor chip and an adhesion promoting coating disposed on the top side of the substrate with a space between the adhesion promoting coating disposed on the front side of the semiconductor chip and the adhesion promoting coating disposed on the top side of the substrate; and
   embedding the semiconductor chip and the top side of the substrate within a plastic housing composition such that the rear side of the semiconductor chip forms an interface with the plastic housing composition, wherein the plastic housing composition extends between the adhesion promoting coating on the front side of the semiconductor chip and the adhesion promoting coating on the top side of the substrate such that the plastic housing compound forms interfaces with the adhesion promoting coating on the front side of the semiconductor chip, the adhesion promoting coating on the top side of the substrate, and surfaces of the flip-chip contacts.

2. The method of claim 1, wherein the adhesion promoting solution comprises 0.1-10 percent by mass of silane, 1-10 percent by mass of deionized water and 85-99 percent by mass of ethanol.

3. The method of claim 2, wherein the silane comprises N-(3-(trimethoxysilyl)alkyl)diamine.

4. The method of claim 1, wherein the adhesion promoting solution comprises 0.1-10 percent by mass of organometallic compounds, 1-10 percent by mass of deionized water and 85-99 percent by mass of alcohol.

5. The method of claim 1, wherein the solvent is evaporated by heating the semiconductor device to a temperature of at least 80-150° C.

6. The method of claim 1, wherein the adhesion promoting solution is applied is provided in the interspaces using a dispensing process.

7. The method of claim 1, wherein the adhesion promoting solution is in the interspaces by dipping portions of the semiconductor chip and substrate in the adhesion promoting solution.

8. The method of claim 7, wherein at least parts of the underside of the substrate are covered prior to dipping portions of the substrate in the adhesion promoting solution such that the parts of the underside are maintained free of an adhesion promoting coating.

9. The method of claim 1, wherein the adhesion promoting solution includes a cleaning solution.

10. The method of claim 1, wherein:
   forming the adhesion promoting coating disposed on the front side of the semiconductor chip includes forming the adhesion promoting coating directly on the front side of the semiconductor chip; and
   forming the adhesion promoting coating disposed on the top side of the substrate includes forming the adhesion promoting coating directly on the top side of the substrate.

* * * * *